United States Patent
Mori et al.

(10) Patent No.: US 7,450,458 B2
(45) Date of Patent: Nov. 11, 2008

(54) DYNAMIC RANDOM ACCESS MEMORIES AND METHOD FOR TESTING PERFORMANCE OF THE SAME

(75) Inventors: Yuki Mori, Tokyo (JP); Renichi Yamada, Fuchu (JP); Shuichi Tsukada, Tokyo (JP); Kiyonori Oyu, Tokyo (JP)

(73) Assignees: Hitachi, Ltd., Tokyo (JP); Elpida Memory, Inc., Tokyo (JP)

( * ) Notice: Subject to any disclaimer, the term of this patent is extended or adjusted under 35 U.S.C. 154(b) by 369 days.

(21) Appl. No.: 11/341,717

(22) Filed: Jan. 30, 2006

(65) Prior Publication Data

US 2006/0203590 A1 Sep. 14, 2006

(30) Foreign Application Priority Data

Mar. 10, 2005 (JP) ............................. 2005-066657

(51) Int. Cl.
*G11C 11/34* (2006.01)
(52) U.S. Cl. .................. 365/222; 365/200; 365/201
(58) Field of Classification Search ............... 365/222, 365/200, 201, 211
See application file for complete search history.

(56) References Cited

U.S. PATENT DOCUMENTS

| | | | | |
|---|---|---|---|---|
| 5,870,348 | A * | 2/1999 | Tomishima et al. | 365/230.06 |
| 5,909,404 | A * | 6/1999 | Schwarz | 365/201 |
| 6,272,588 | B1 * | 8/2001 | Johnston et al. | 711/106 |
| 6,697,992 | B2 * | 2/2004 | Ito et al. | 714/763 |

OTHER PUBLICATIONS

P.J. Restle et al., "DRAM Variable Retention Time", I.E.D.M. Technology Digest (1992), pp. 807-810.
D.S. Yaney et al., "A Meta-Stable Leakage Phenomenon in DRAM charge Storage—Variable Hold Time", I.E.D.M. Technology Digest (1987), pp. 336-339.

* cited by examiner

*Primary Examiner*—Richard Elms
*Assistant Examiner*—Hien N Nguyen
(74) *Attorney, Agent, or Firm*—Reed Smith LLP; Stanley P. Fisher, Esq.; Juan Carlos A. Marquez, Esq.

(57) ABSTRACT

The present invention enables screening of the so-called variable retention time (VRT) failure, namely a retention failure occurring in a DRAM due to fluctuation of a data retention time like a random telegraph noise. A pause/refresh test for checking a data retention function is repeated at all memory cells of a chip so that memory cells at which the retention failure due to random fluctuation of the data retention capability over time may occur is subjected to screening.

15 Claims, 14 Drawing Sheets

DYNAMIC RANDOM ACCESS MEMORIES AND METHOD FOR TESTING PERFORMANCE OF THE SAME

CLAIMS OF PRIORITY

The present application claims priority from Japanese Application JP 2005-066657, filed on Mar. 10, 2005, the content of which is hereby incorporated by reference into this application.

BACKGROUND OF THE INVENTION

1. Field of the Invention

The present invention relates to a dynamic random access memory and a method of testing performance of the same, and more specifically to a technique for accurately screening VRT failure in a dynamic random access memory within a short period of time.

2. Description of the Related Arts

An equivalent circuit of a memory cell in a dynamic random access memory (hereinafter referred to as DRAM) is shown in FIG. 2. In FIG. 2, reference numeral 10 denotes a switch transistor in a memory cell, namely a memory cell transistor, and a memory cell transistor 10 has four terminals of a word like 1a, a bit line 1b, a storage node 1c, and a substrate terminal 1d, and an accumulator/condenser 20. Furthermore the accumulator/condenser 20 has a capacitor upper electrode 2.

Generally the memory cell transistor 10 is an N-type MOS transistor. The memory cell transistor 10 is activated (set in the selected state) when a "high" voltage is applied to the word line 1a, and is inactivated (set in the not-selected state) when a "low" voltage is applied to the word line 1a. Operations for reading from or writing information stored in a memory cell are performed when the corresponding memory cell is in the activated state. In other words, when logic "1" is written (the operation is referred to as "write" hereinafter), a voltage corresponding to the logic "1" is applied to the bit line 1b while the "high" voltage is applied to the word line 1a connected to a gate of the memory cell transistor 10. In this state, a current flows between a drain and a source in the memory cell transistor 10, and an accumulator/condenser 20 connected to the storage node 1c is charged with a voltage for the logic "1". When a "low" voltage is applied to the word line 1a, the memory cell transistor 10 is turned OFF, and the accumulator/condenser 20 keeps the voltage for logic "1" charged therein (this state is referred to as "pause" hereinafter). When the logic "0" is written, a voltage for the logic "0" is applied to the bit line 1b in the activated state.

When the information is read out (the operation is referred to as "read" hereinafter), an electric potential in the accumulator/condenser 20 is drawn onto the bit line 1b via a drain-source path in the memory cell transistor 10 by applying the "high" voltage to the word line 1a, and the resulting signal is detected by a sense amplifier to determine whether the voltage is for "0" or "1".

In the pause state, a leakage current is generated due to a reverse bias generated in a PN junction between the storage node 1c and the substrate terminal 1d. Because the accumulated electric charge dissipates in association with lapse of time due to the leakage current, for data retention it is necessary to refresh data at a prespecified interval (an operation for repeating read and rewrite).

A leakage current generated in the pause state varies in each memory cell and accordingly data retention time also varies in each cell. Therefore, before DRAMs are shipped, it is necessary to conduct a data retention test in all cells in a chip to insure retention of data for a period of time longer than the refreshing interval. Assessment of a cell for the capability of data retention is generally carried out by a test called as the pause/refresh test.

The pause/refresh test is performed by repeating the pause and read operations by writing "1" in a memory cell to be tested in the state where the transistor is turned ON. The pause time is decided based on the refresh interval as a reference. Generally, before shipment of memory cells, the pause/refresh test is carried out once, or twice by changing the testing conditions including a voltage applying pattern to cells other than the tested memory cell at pause or pause time tPAUSE as shown in FIG. 3.

It has been considered that the data retention time is fixed to a constant value specified to the memory cell, and also that retention failure can completely be screened off by carrying out once the test for each testing condition as described above. However, it has been reported, for instance, in Non-patent documents 1 and 2, that, in some memory cells, the fluctuation of data retention time like random telegraph noise as shown in FIG. 4 occurs. The fluctuation of data retention time over time as described above is referred to as Variable Retention Time (VRT). As shown in FIG. 4, in relation to the VRT phenomenon, it is often observed that a good state in which the data retention time continues for a long period of time and a bad state in which the data retention time continues only for a short period of time occur alternately, and the fluctuation includes two states or three or more states. A period of time in which each state continues varies each time measurement is performed and the fluctuation is irregular. In a memory cell showing the VRT phenomenon, even if it is determined that the data retention time is sufficiently long because the good state is observed in the shipment test, the data retention time becomes shorted because of occurrence of the bad state after shipment, which may sometimes cause retention failure. The retention failure caused by the VRT is referred to as "VRT failure" hereinafter.

Although the VRT failure is a serious failure for a customer, a frequency of occurrence of the VRT failure is extremely low. For this reason, the technique for eliminating the VRT failure has not been established.

[Non-patent document 1] D. S. Yaney, et al. "1987 I.E.D.M Technology Digest (1987)", 1987, pp 336-339

[Non-patent document 2] P. J. Restle, et al., "1992 I.E.D.M Technology Digest (1992)", 1992, pp 807-810

SUMMARY OF THE INVENTION

A frequency of occurrence of the VRT failure tends to increase in association with increase in an integration degree in a DRAM. Assuming that the frequency of occurrence of a memory cell with the VRT failure is constant, when the integration degree in a DRAM is doubled, also the probability that a VRT-defective memory cell is present in one chip becomes doubled. To increase the integration degree in a DRAM in the future, development of the testing method for completely eliminating the VRT failure will be essential.

An object of the present invention is to establish a testing method for accurately screening off cells having the VRT failures, which can not be screened off by the pause/refresh test based on the conventional technology, not only within a short period of time but also without giving any damage to non-defective cells other than the VRT-defective memory cells.

The most important feature of the present invention consists in that the pause/refresh test is repeated optimized times under the same testing conditions to screen off VRT-defective memory cells. A frequency of VRT fluctuation tends to rise as a temperature goes higher, and therefore by repeatedly carrying out the pause/refresh test at a temperature higher than the ordinary operating temperature, the time required for testing can be shortened. Further during the pause/refresh test, by realizing, just before start of the pause/refresh test, a state in which a high reverse bias is applied to the PN junction in the storage node side of each memory cell or a state in which a forward bias is applied, or a state in which there is no electric field, the efficiency in detecting VRT-defective memory cells can be improved.

Furthermore, by realizing, just before start of the repeated pause/refresh test, a state in which a carrier having high energy in the PN junction in the storage node side is generated, namely a state in which a high and reverse bias is applied, or a bias state in which a number of hot carriers are generated due to impact ionization, it is possible to screen off also memory cells in which the VRT failure may occur anew because of a tress caused by a rewrite operation.

With the present invention, it is possible to screen off cells having the VRT failures, which can not be screened off by the pause/refresh test based on the conventional technology not only within a short period of time but also without giving any damage to normal cells other than the VRT-defective memory cells.

DESCRIPTION OF THE PREFERRED EMBODIMENTS

Optimizing the number of tests, the voltage applied during the testing, and the procedure thereof realizes the object of screening out cells having the VRT failures, and installing a test circuit such as a switching circuit between a screening voltage generating circuit and a normal operating circuit makes the testing shorter and easier to perform.

FIRST EMBODIMENT

Figure 1:
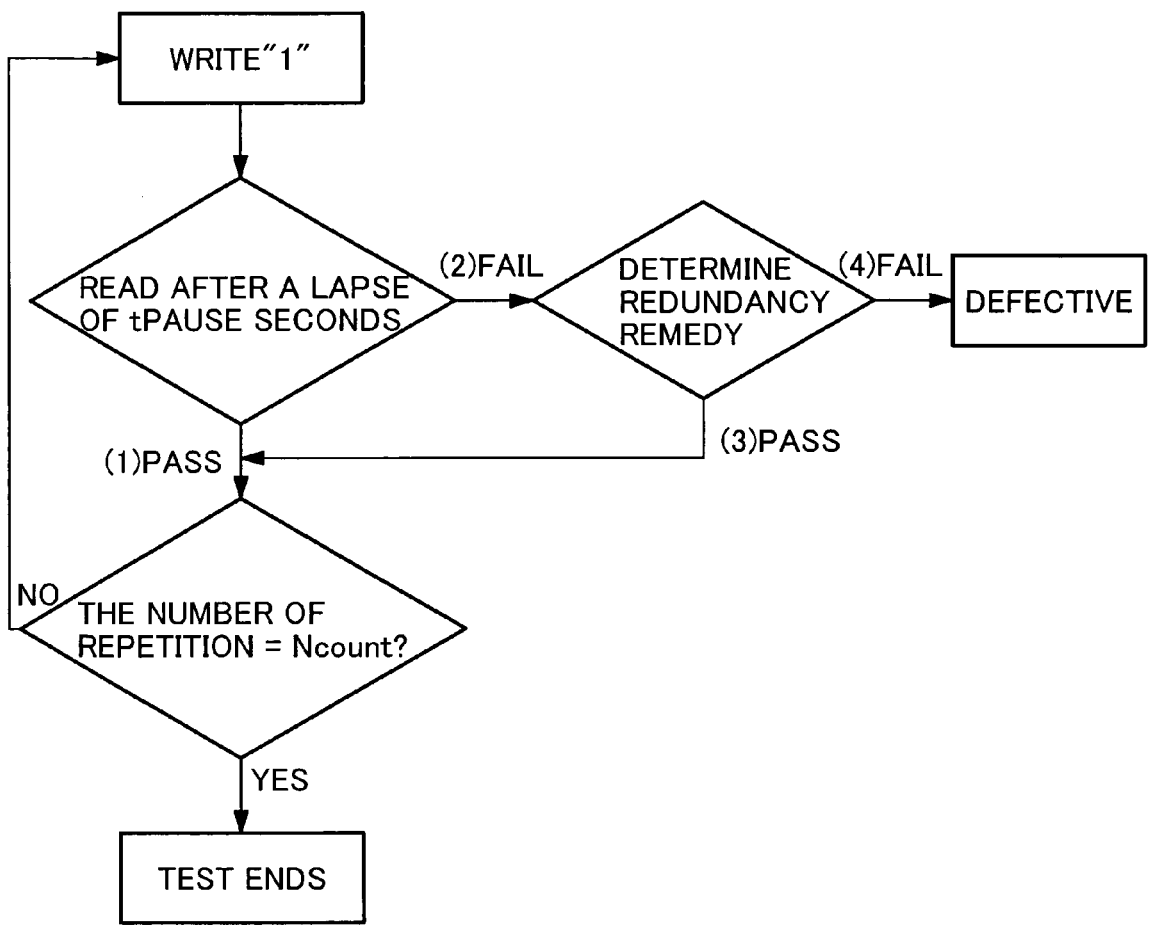
FIG. 1 is a schematic diagram illustrating a method of checking a DRAM (according to a first embodiment)
Figure 2:
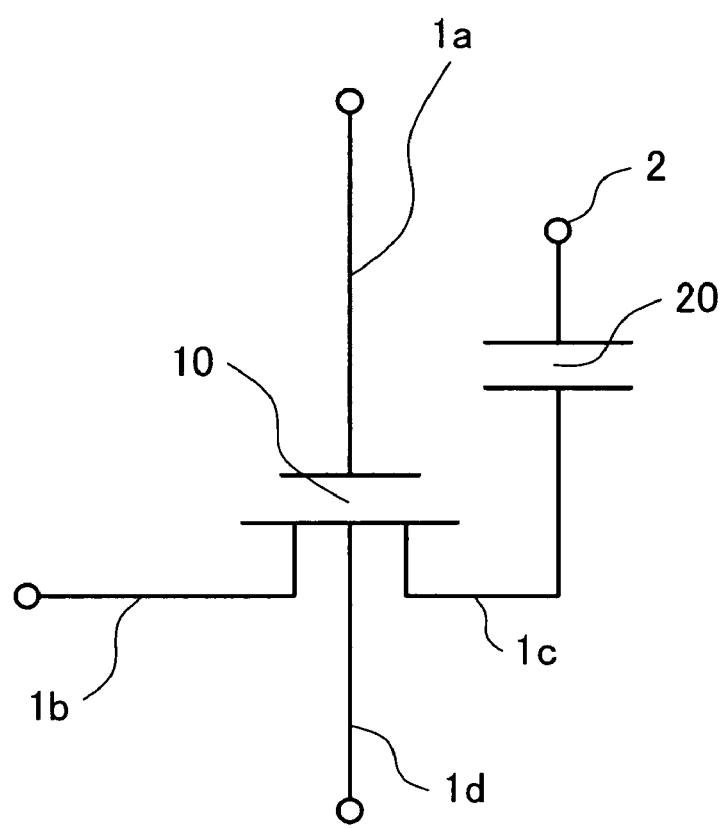
FIG. 2 is a schematic diagram illustrating a memory cell in a DRAM.
Figure 3:
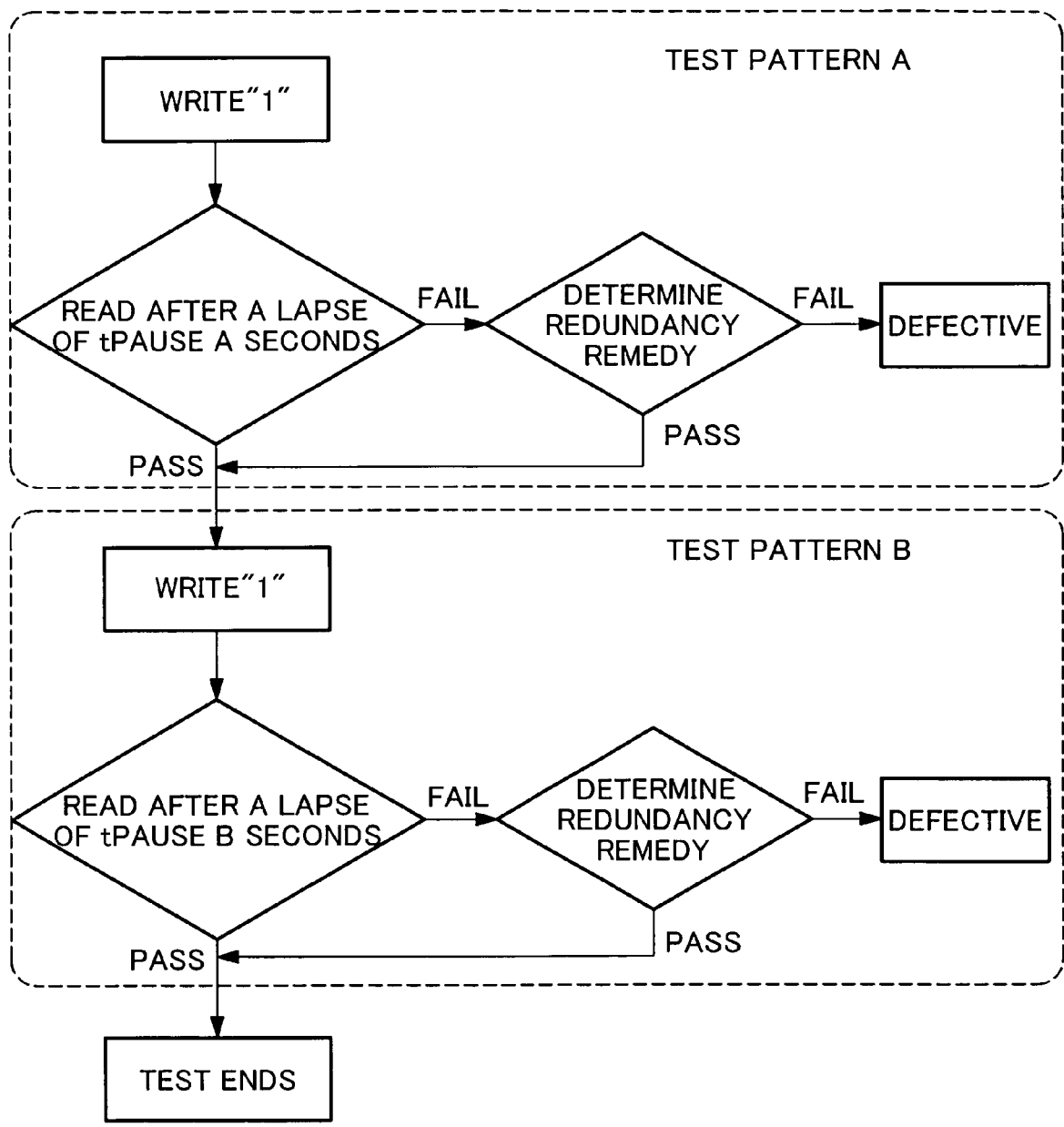
FIG. 3 is a schematic diagram illustrating a method of checking a DRAM based on the conventional technology.

FIG. 1 illustrates a procedure of testing for a VRT failure screening according to a first embodiment of the present invention. This is a pause/refresh test based on a configuration starting by writing "1" to a memory cell followed by a pause for tPAUSE seconds and reading thereafter. For tPAUSE, an actual time of an interval of refresh time for operating a product or a slightly longer time than the same is selected. A cell that caused an error during the reading is regarded as a fail cell and a redundancy remedy is attempted (FIG. 1, (2)). The chip that caused an error here again is regarded as a defective product (FIG. 1, (4)). When all of the memory cells passes the test at the reading after the pause (FIG. 1, (1)), or when the redundancy remedy is valid (FIG. 1, (3)), the test described above is repeated for a specified number of repetition (Ncont). The pause of tPAUSE seconds described above may not be equal for each time of repetition.

Figure 4:
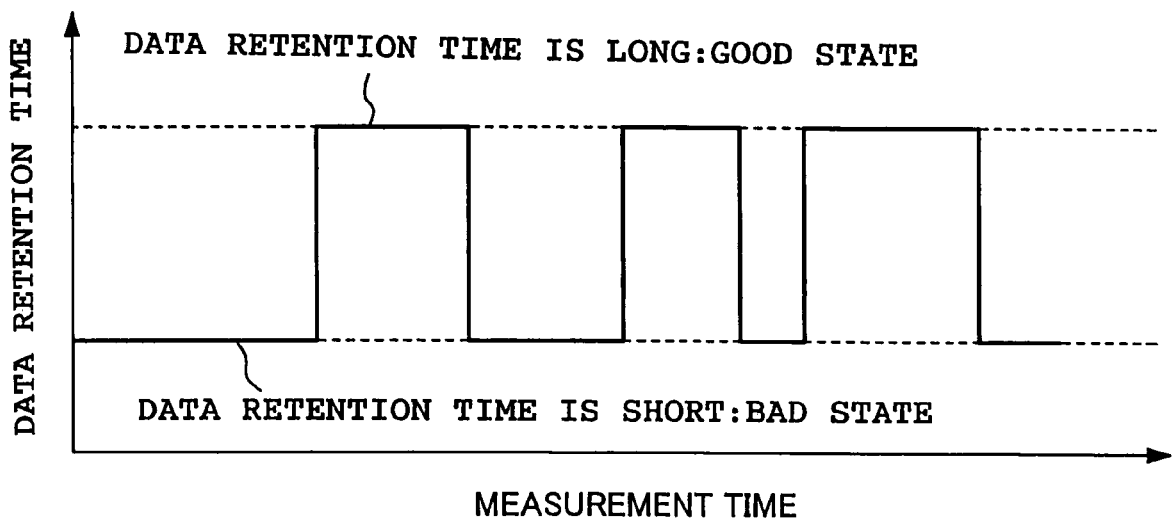
FIG. 4 is a schematic diagram illustrating the variable retention time (VRT) phenomenon.

When a chip under test includes a VRT-defective memory cell indicating the fluctuation of the data retention time as shown in FIG. 4, a bad state appears in the nth pause/refresh test depending on the frequency of the fluctuation and is screened out.

Figure 5:
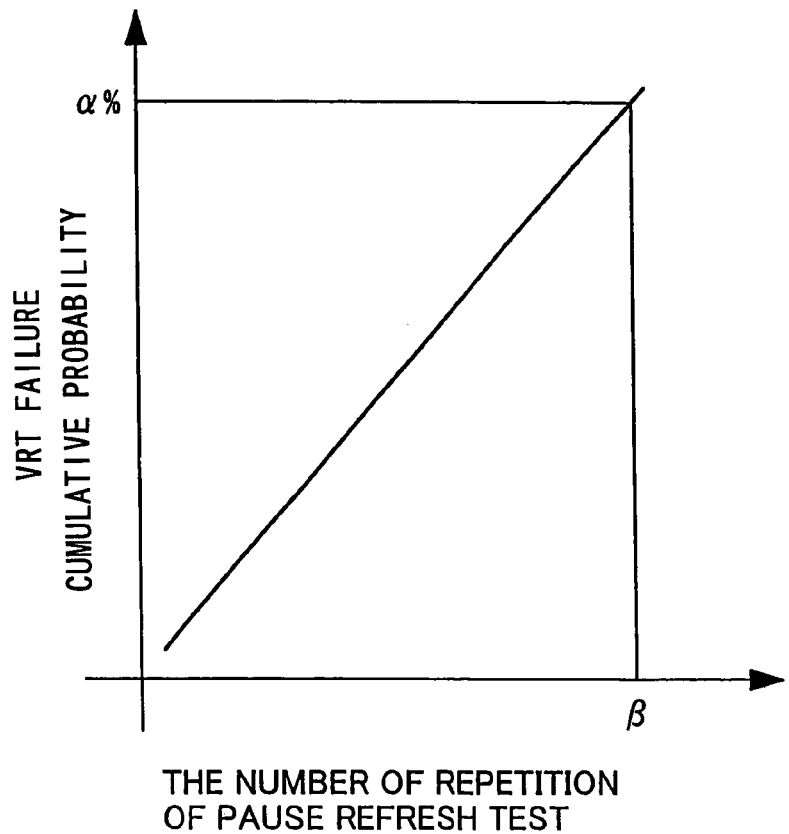
FIG. 5 is a schematic diagram illustrating a technique for optimizing conditions for checking a DRAM (in the first embodiment)

In FIG. 1, Ncont means a value optimized for screening out cells having the VRT failures, which is computed when the DRAM under test is developed and the like. For instance, as shown in FIG. 5, the relation between the VRT failure detection rate and the number of repetition of the pause/refresh test described above is computed so that the number β of repetition of the test to the target screening rate α is the optimal value of the screening condition. The more the number of repetition of the test is, the better the screening rate is, but the increase of the testing time leads to the increase of the production cost in the meantime. Therefore the testing time must be as short as possible. The upper limit for the number of repetition of the test is generally determined by the testing cost determined in association with the testing time. Therefore, setting the target screening rate and computing the optimal value of the number of repetition of the test as described above is a significant procedure in view of saving cost and high reliability.

Also, as disclosed in non-patent documents 1 and 2, the VRT fluctuation tends to be more frequent as the temperature increases. Therefore, when the test shown in FIG. 1 is performed under the temperature higher than the normal operating temperature, a smaller value can be set as Ncont and the screening can be performed in a shorter time.

When the test is applied to all the memory cells in one chip, the test time can be reduced by simultaneously performing the voltage application shown in FIG. 1 to a plurality of memory cells. For instance, the test in FIG. 1 may be performed simultaneously on all the memory cells in the chip, or the memory cells may be divided into several groups to be tested group by group. Also, a part of the steps of writing, pausing, and reading shown in FIG. 1 may be divided and the rest may be performed on all the memory cells at the same time. For instance, as shown in FIG. 6, only the writing and reading are performed on divided groups of some memory cells and pausing is performed simultaneously.

Figure 6:
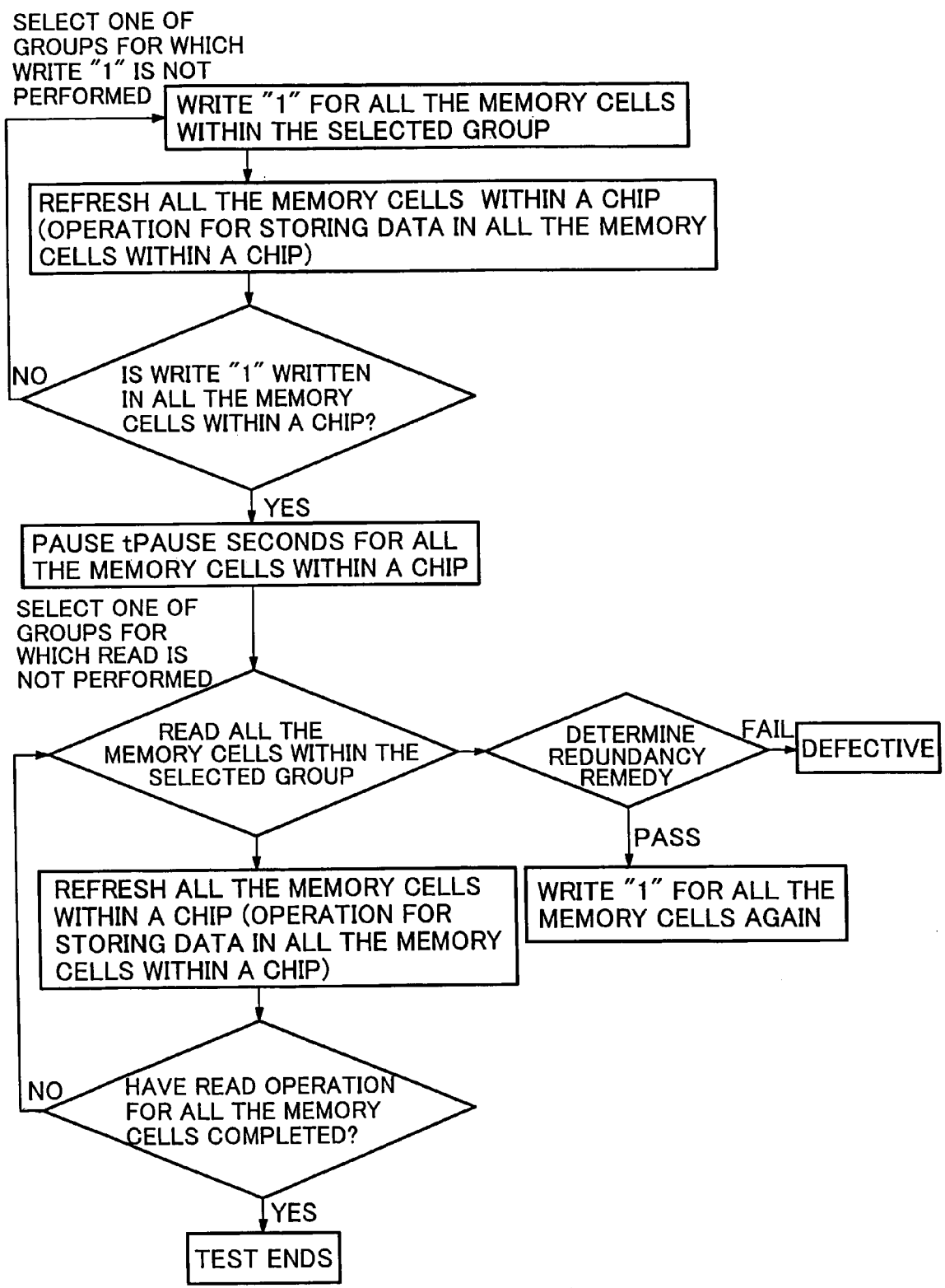
FIG. 6 is a schematic diagram illustrating a DRAM checking method (in the first embodiment)

The test procedure shown in FIG. 6 is described below. All the memory cells in the chip are divided into several groups. After all the memory cells in a specific group at the same time are written, the refresh operation is performed on all the memory cells in the chip. The refresh operation produces a state in which a voltage for the logic "0". is rewritten in a logic "0" storing memory cell and a voltage for the logic "1" is rewritten in a logic "1" storing memory cell by an operation of a sensor amplifier.

Next, one group on which the writing in this test is not performed is selected to write on all the memory cells therein and then to refresh all the memory cells in the chip. The refresh operation retains the written state not only in the group on which the writing has been performed this time but also in other groups on which the writing was performed earlier. In this way, writing to all the memory cells in a certain group and refreshing all the memory cells in the chip are performed once per group until all the memory cells in the chip are in a written state. After all the memory cells in the chip has been in a written state, pausing for tPAUSE seconds is performed simultaneously on all the memory cells in the chip. After the pausing, the reading is performed group by group as in the writing step.

The test may be performed any time. That is, the test may be performed during the wafer testing, after dicing of the wafer into chips, or after fabrication in a package.

SECOND EMBODIMENT

Figure 7:
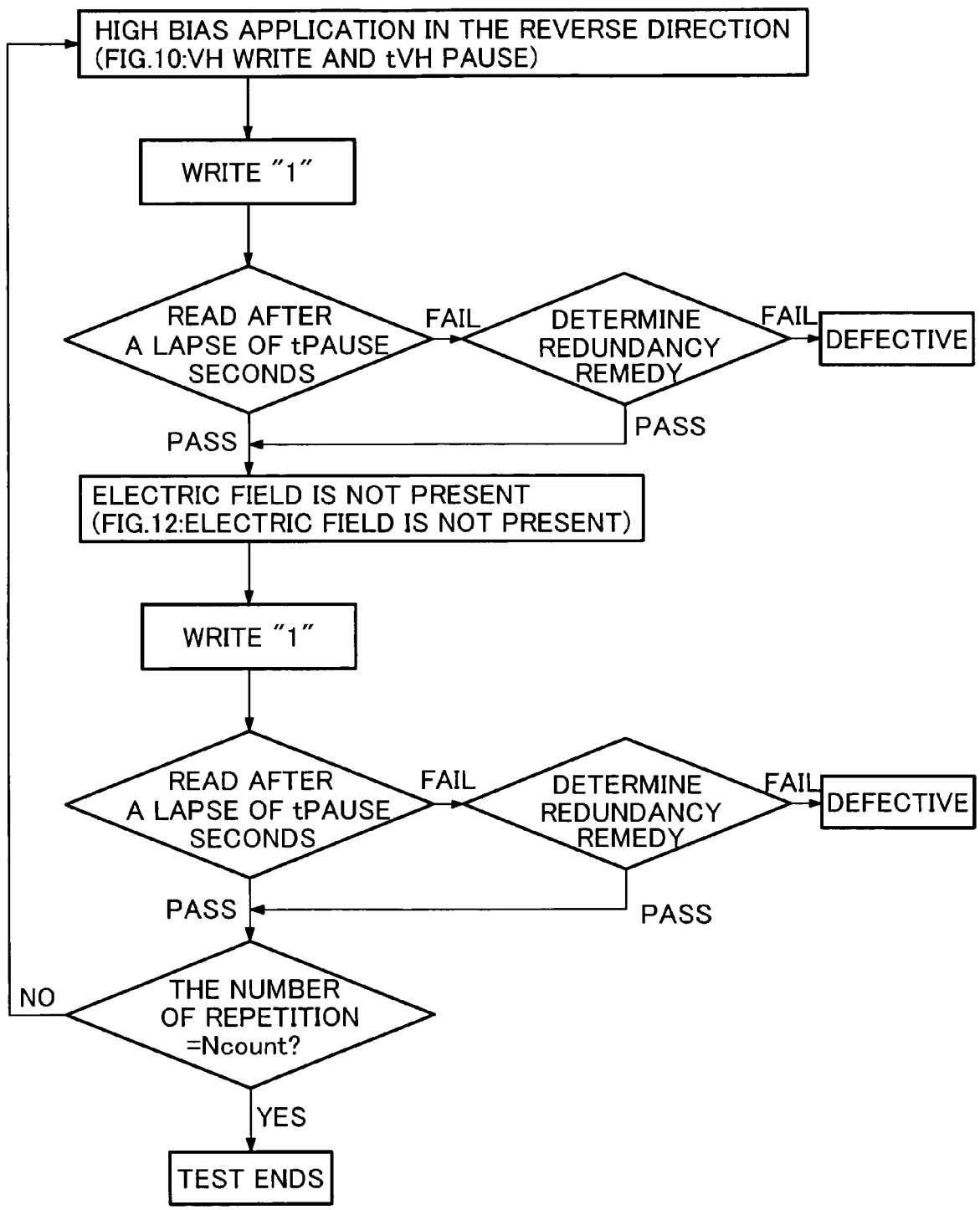
FIG. 7 is a schematic diagram illustrating a DRAM checking method and showing a testing flow for applying a reverse and high bias and a testing flow for realizing a state in which no electric field is present (according to a second embodiment)

FIG. 7 shows a test procedure of testing for a VRT failure screening according to a second embodiment, and FIGS. 8 to 12 detail the bias conditions for testing. The feature of the present embodiment (FIG. 7) is to produce a state in which a high bias in the reverse direction is applied to the PN junction on the storage node side of the memory cell (FIG. 9) or a state in which an electric field is not present (FIG. 11) before each testing for the repeated pause/refresh test shown in FIG. 1. As described below, with the present embodiment, the VRT failures can be screened in a shorter time and more reliably than the first embodiment.

In order to reduce the time for screening the VRT failures, it is necessary to accelerate elicitation of the VRT failures, namely to increase the occurrence rate of the bad state per unit of time.

As a result of investigation for the occurrence rate of the bad state using some memory cells having the VRT failures as samples, the occurrence rate was found to vary with respect to each memory cell. The occurrence rate of the bad state also tended to depend on the bias (substantially decided by the difference between a bit line voltage level at writing and a substrate voltage level at pausing) applied to the PN junction on the storage node side at the time of pausing in any cases. However, the way to depend on the bias varied from sample to sample, and the occurrence rate of the bad state increased as the reverse bias went higher in some samples, while other samples presented the opposite phenomenon. The degree of the change by the bias also varied among the samples.

It was also observed that the bad state appeared by applying a higher or lower bias than writing "1" remained for a period of time even after the writing "1" bias is applied later. Then, as shown in FIG. 7, the state applied with the high bias or the electric field-free state was added just before each testing for the repeated pause/refresh test described in the first embodiment to confirm that the frequency of detecting the VRT failures had improved several folds compared with the case where such a state is not added.

Figure 10:
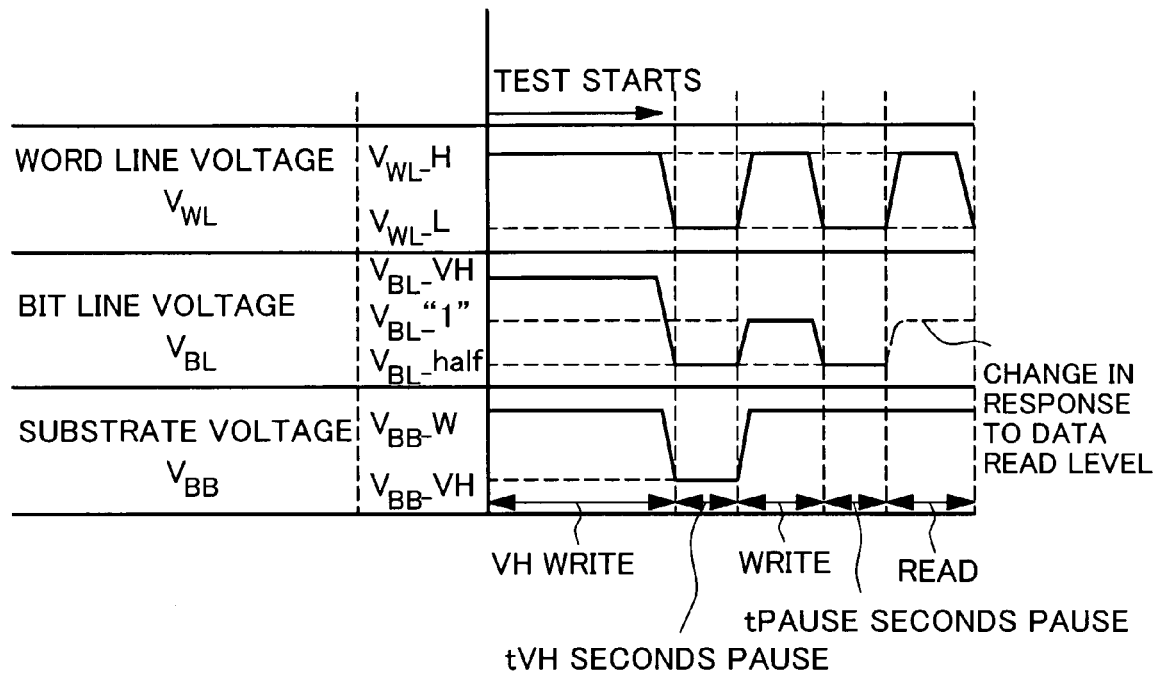
FIG. 10 is a schematic diagram illustrating a bias applying flow in checking a DRAM in the second embodiment (an example in which a voltage is applied to each terminal in the pause/refresh test after a reverse and high bias (VH) is applied))

FIG. 10 shows an example of the bias state in each terminal when the high reverse bias at PN junction is applied immediately before the pause/refresh test. A procedure of applying the bias in this test is described below.

Figure 8:
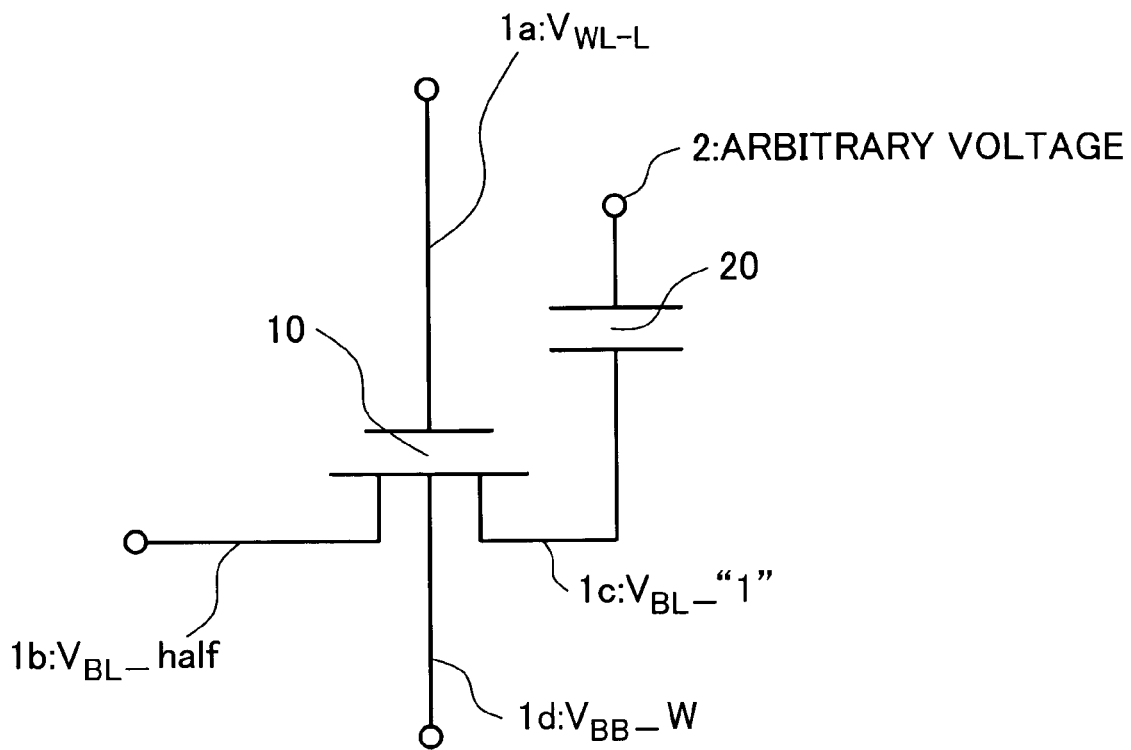
FIG. 8 is a schematic diagram illustrating a bias state in the pause state after "1" is written in a DRAM (in the second embodiment)
Figure 9:
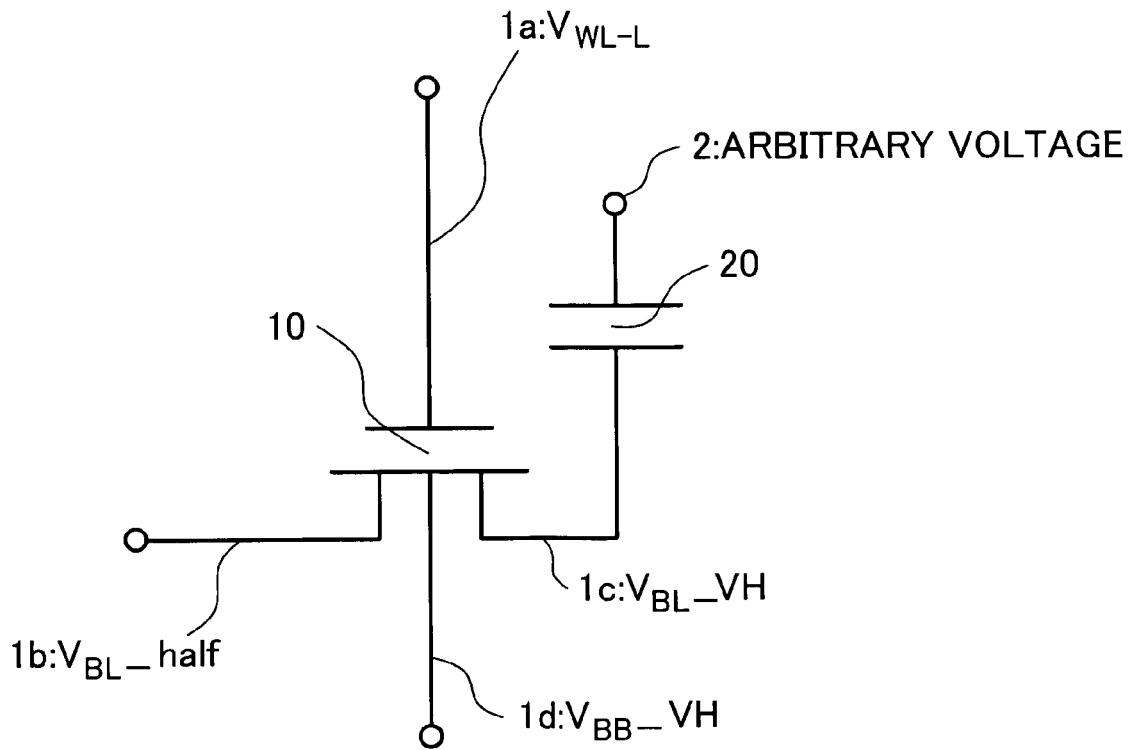
FIG. 9 is a schematic diagram illustrating a bias state in checking a DRAM in the second embodiment (in which a reverse and high bias (VH) is applied (in the pause state for tVH seconds in FIG. 10))

At first, a "high" voltage VWL_W is applied to a word line 1a, a voltage VBL_VH higher than the writing "1" voltage VBL_"1" is applied to a bit line 1b, and a substrate voltage at writing VBB_W is applied to a substrate terminal 1d around the same time. A voltage of VBL_VH is then charged into an accumulator/condenser 20 connected to the side of a storage node 1c. Next, a pausing time of tVH seconds is taken in a state that a "low" voltage VWL_L is applied to the word line 1a and a voltage VBB_VH higher than VBB_W in the negative direction is applied to the substrate terminal 1d. The bit line 1b may have any electrical potential, and a voltage V_half intermediate between the writing "1" voltage VBL_"1" and the writing non voltage VBL_"0" may be applied as shown in FIG. 10. At this time, a memory cell transistor is turned off, and a reverse bias determined by (VBL_VH-VBB_VH) is produced at the PN junction between the storage node and the substrate (FIG. 9). The bias produced at this time is higher than a bias produced at the time of pausing after writing "1" (FIG. 8). The pause/refresh test is performed after such a high bias has been applied at the PN junction on the storage node side. That is, as shown in FIG. 10, after a pause of tPAUSE seconds, writing "1", pausing for tPAUSE seconds, and reading are performed to evaluate the data storing capability of the memory cell under test. As described above, in the pause/refresh test after application of such a high bias, a type of the VRT failure presenting higher occurrence rate of the bad state by the application of the high bias is more easily screened.

Figure 12:
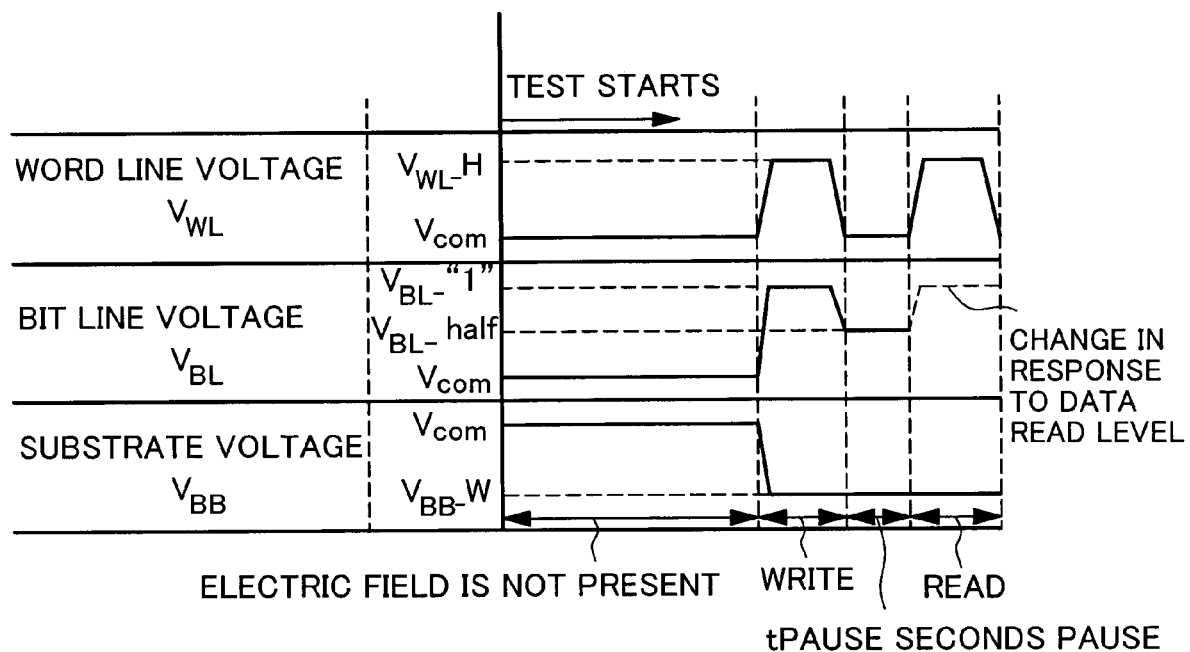
FIG. 12 is a schematic diagram showing a bias applying flow in checking a DRAM in the second embodiment (an example of a flow of applying a voltage to each terminal in the pause/refresh test after the state in which no electric field is present)

On the other hand, FIG. 12 shows an example of the bias state in each terminal when the electric field-free state is added immediately before the pause/refresh test. A procedure of applying the bias in this test is described below.

Figure 11:
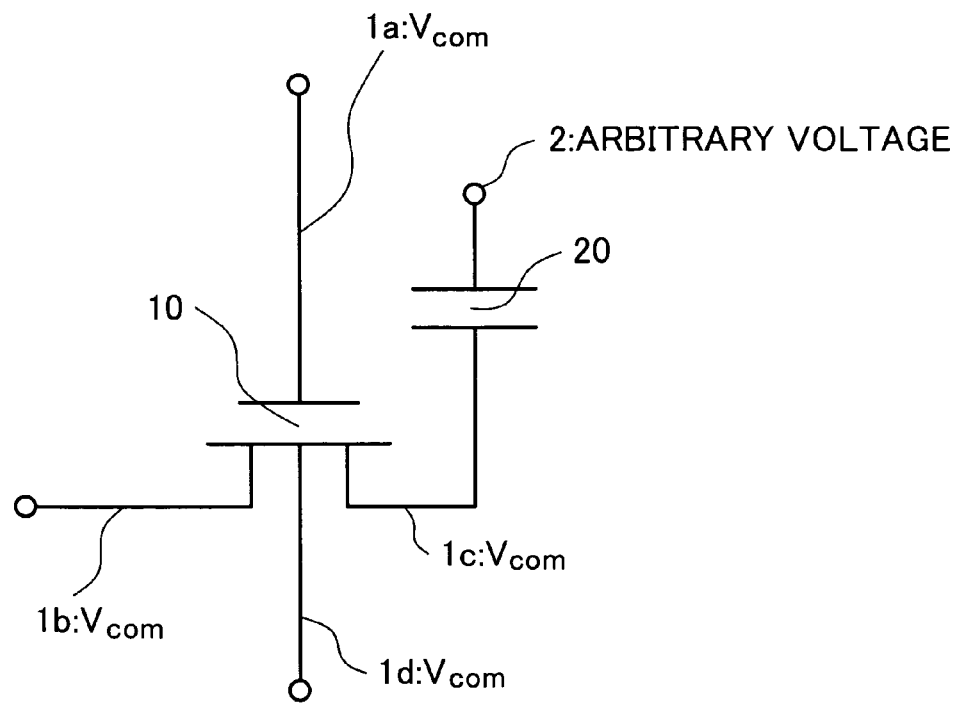
FIG. 11 is a schematic diagram illustrating a bias state (in which no electric field is present) in checking a DRAM in the second embodiment.

At first, each of the electric potentials of the word line 1a, the bit line 1b, the storage node 1c, and the substrate terminal 1d is set to be equal to Vcom (FIG. 11). The Vcom may be any value. At this time, an electric field is substantially not present between the storage node 1c and the substrate 1d. Then, as shown in FIG. 12, writing "1", pausing for tPAUSE seconds, and reading are performed to evaluate the data storing capability of the memory cell under test. As described above, in the pause/refresh test after such an electric field-free state, a type of the VRT failure presenting higher occurrence rate of the bad state by the application of the low bias is more easily screened.

Therefore, in order to screen both the type presenting higher occurrence rate of the bad state by the application of the high bias and the type presenting higher occurrence rate of the bad state by the application of the low bias, both pause/refresh tests after application of the high bias and after the application of a voltage in the electric field-free state as shown in FIGS. 10 and 12 may be performed. For instance, the tests may be performed alternately as shown in FIG. 7. For the number of repetition of the tests Ncont, an optimized value is selected as described in the first embodiment.

While the pause/refresh tests after application of the high bias and after application of voltage in the electric field-free state are alternately performed in FIG. 7, the pause/refresh tests after the voltage application in the electric field-free state may be repeated for Ncont times after the pause/refresh tests has been repeated after application of the high bias for Ncont times. That is, repeating each test for Ncont times is important but in any order.

Also, the step of "applying Vcom to the word line 1a, the bit line 1b, the storage node 1c, and the substrate terminal 1d" in FIGS. 11 and 12 may be replaced by a step of "making the word line 1a, the bit line 1b, the storage node 1c, and the substrate terminal 1d in an electrically unstable (open) state", which also provides an effect of making it to realize the electric field-free state between the storage node and the substrate.

When this test is applied to all the memory cells in the chip, the test time can be reduced by simultaneously performing the voltage application in FIG. 7 to a plurality of the memory cells. For instance, the test in FIG. 7 may be performed simultaneously on all the memory cells in the chip, or the memory cells may be divided into several groups to be tested group by group. Also, a part of the step shown in FIG. 7 may be divided and the rest may be performed on all the memory cells at the same time. For instance, in the step of VH writing, as with the writing "1" step in FIG. 6, the operation is performed on divided groups of some memory cells and pausing is performed simultaneously when VBL_VH has been written in all the memory cells in the chip. Writing "1", pausing, and reading afterward may be performed similar to FIG. 6.

With the second embodiment, it is necessary to produce the biases not used in the normal operation, namely VBH_VH and VBB_VH. The biases may be applied from the outside of the chip, but performing the test in this embodiment in a test mode is facilitated by adding a dedicated test circuit and a switching circuit for the same within the chip.

It should be noted that when this test is used for screening before shipping products, the test is not allowed to deteriorate good memory cells other than memory cells having the VRT failures. Therefore, the bias condition for the step of applying the high reverse bias at the PN junction is determined in such a range that the good memory cells will not be deteriorated.

The test may be performed any time. That is, the test may be performed during the wafer testing, after dicing of the wafer into chips, or after fabrication in a package.

THIRD EMBODIMENT

Figure 13:
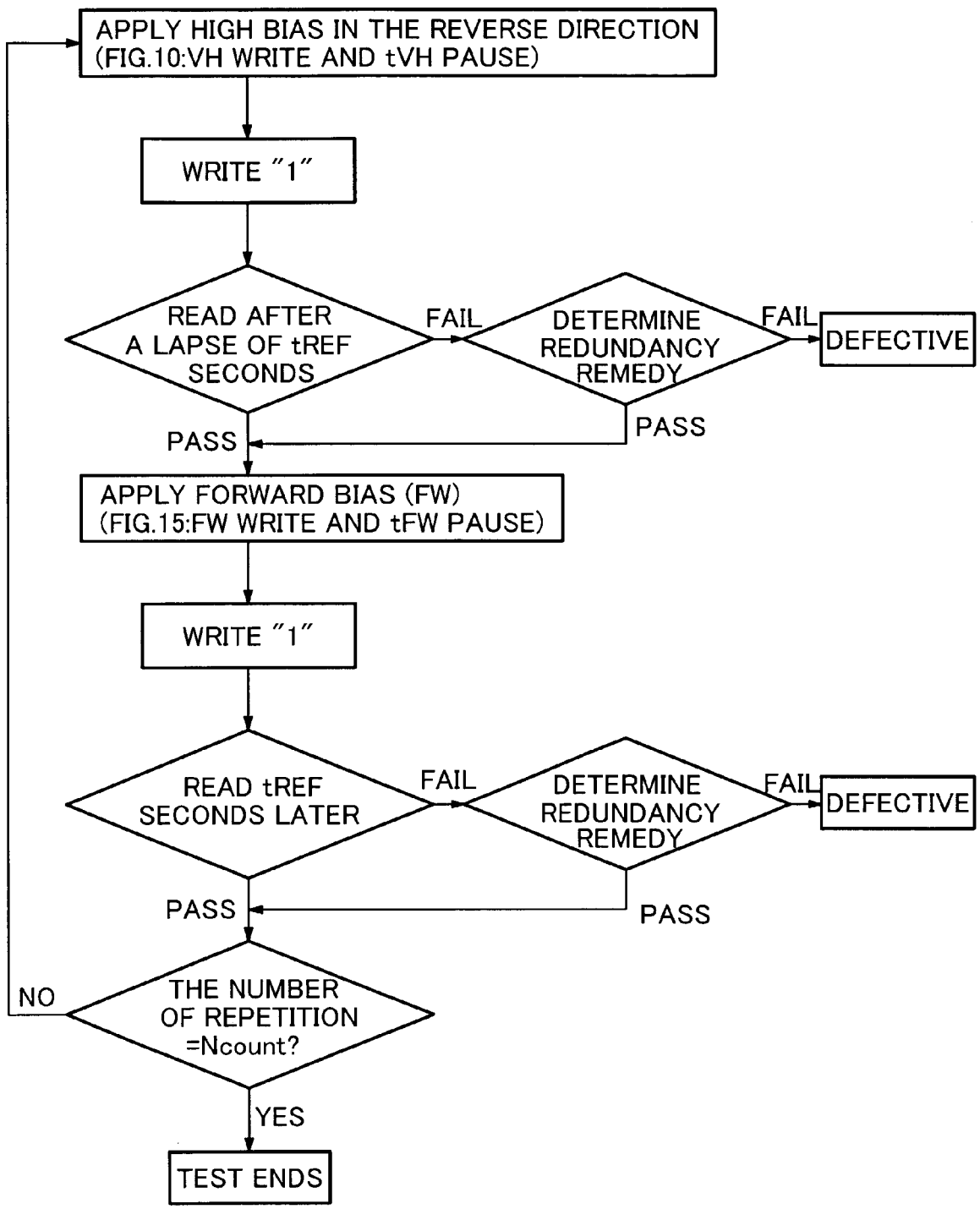
FIG. 13 is a schematic diagram illustrating a DRAM checking method (a testing flow for applying a reverse and high bias and also for applying a forward bias) (according to a third embodiment)
Figure 14:
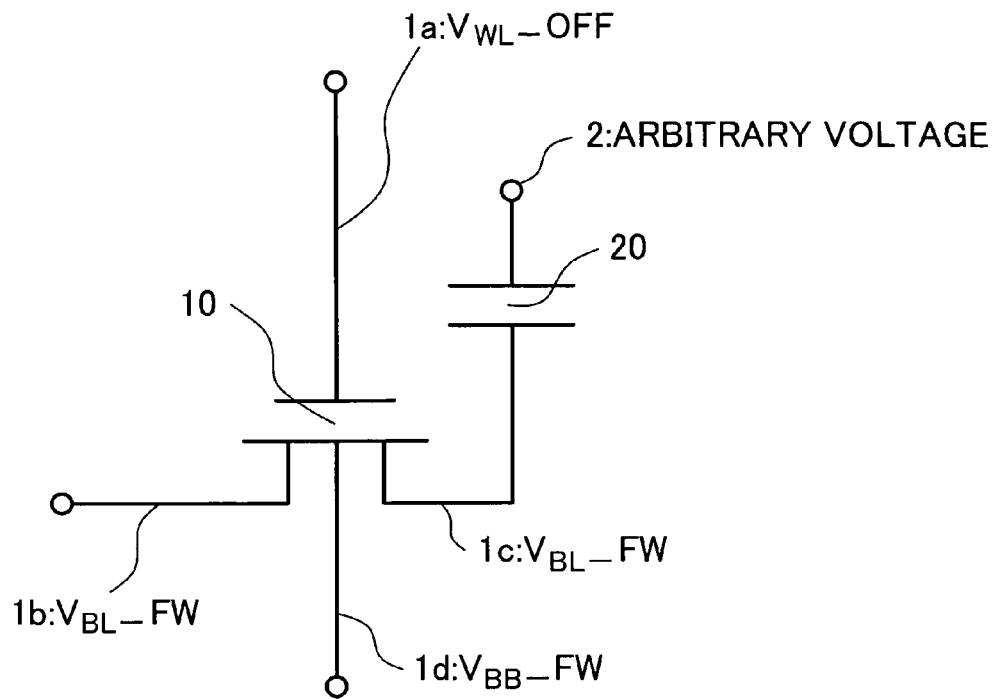
FIG. 14 is a schematic diagram illustrating a bias state in checking a DRAM in the third embodiment (a state in which forward bias (FW) is applied (the pause state for tFW seconds in FIG. 15))
Figure 15:
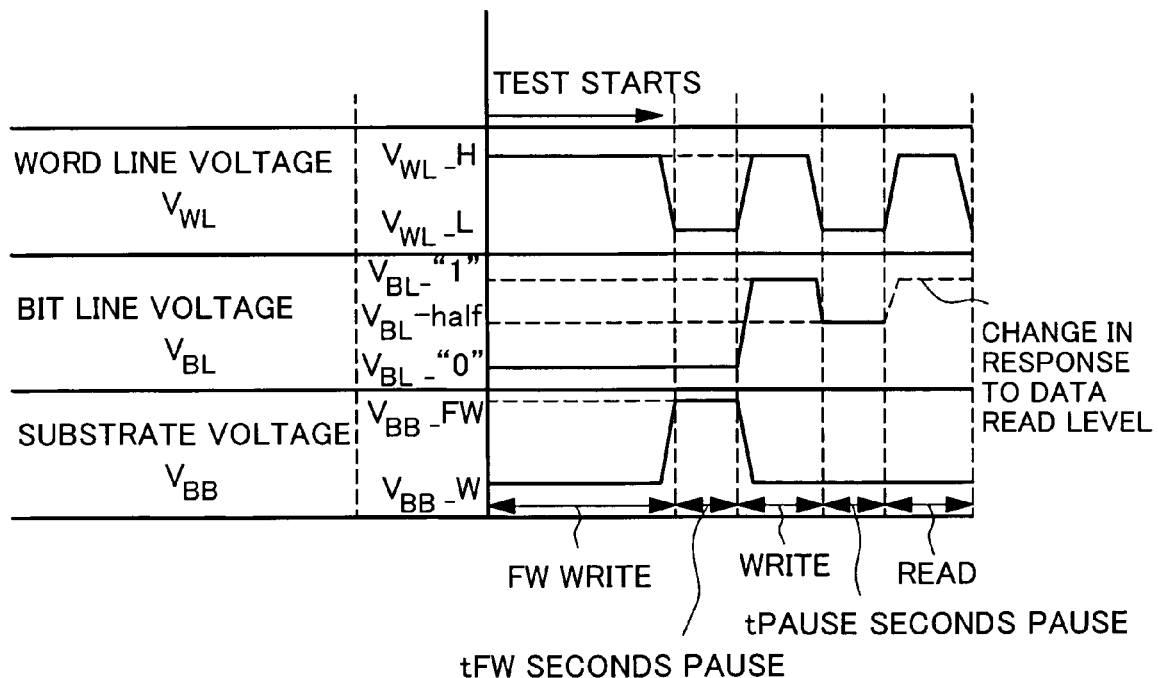
FIG. 15 is a schematic diagram illustrating a bias applying flow in checking a DRAM in the third embodiment (a flow of applying a voltage to each terminal in the pause/refresh test after a forward (FW) bias is applied)

FIG. 13 shows a test procedure of testing for a VRT failure screening according to a third embodiment, and FIGS. 14 and 15 detail the bias conditions for testing. The feature of the present embodiment (FIG. 13) is that the step of voltage application in the electric field-free state in the repeated pause/refresh test described in the second embodiment is replaced by a step of bias application in the forward direction (FIG. 14).

It was stated in the second embodiment that the bad state more easily appears in some of the memory cells having the VRT failures when the bias (in the reverse direction) lower than writing "1" is applied to the PN junction on the storage node side. When the forward bias was applied to such a memory cell, it was found that the occurrence rate of the bad state increased as with the case of applying the low bias in the reverse direction.

FIG. 15 shows an example of the bias state in each terminal when the forward bias is applied immediately before the pause/refresh test. A procedure of applying the bias in this test is described below.

At first, the "high" voltage VWL_W is applied to the word line 1a, the writing "0" voltage VBL_"0" is applied to the bit line 1b, and the substrate voltage at writing VBB_W is applied to the substrate terminal 1d around the same time. The voltage of VBL_"0" is then charged into the accumulator/condenser 20 connected to the side of the storage node 1c. Next, the "low" voltage VWL_L is applied to the word line 1a and a bias VBB_FW higher than VBL_"0" is applied to the substrate terminal 1d around the same time. The bit line 1b may have any electrical potential, and the voltage V_half intermediate between the writing "1" voltage VBL_"1" and the writing "0" voltage VBL_"0" may be applied as shown in FIG. 15. At this time, a memory cell transistor is turned off, and a forward bias determined by (VBB_FW-VBL_"0") is produced at the PN junction between the storage node and the substrate (FIG. 14). The pause/refresh test is performed after such a forward bias has been applied at the PN junction on the storage node side. Namely, as shown in FIG. 15, after a pause of tPAUSE seconds, writing "1", pausing for tPAUSE seconds, and reading are performed to evaluate the data storing capability of the memory cell under test. As described above, in the pause/refresh test after application of such a forward bias, a type of the VRT failure presenting higher occurrence rate of the bad state by the application of the reverse bias is more easily screened.

Therefore, in order to screen both the type presenting higher occurrence rate of the bad state by the application of the high reverse bias at the PN junction and the type presenting higher occurrence rate of the bad state by the application of the low reverse bias, both pause/refresh tests after the application of the high reverse bias and after the application of the forward bias as shown in FIGS. 10 and 15 may be performed. For instance, the tests may be performed alternately as shown in FIG. 13. For the number of repetition of the tests Ncont, an optimized value is selected as described in the first embodiment.

While the pause/refresh tests after the application of the high reverse bias at the PN junction and after the application of the forward bias are alternately performed in FIG. 13, the pause/refresh tests after the application of the high reverse bias may be repeated for Ncont times, and thereafter the pause/refresh tests after the application of the forward bias may be repeated for Ncont times. That is, repeating each test for Ncont times is important but in any order.

The procedure of applying this test to all the memory cells in the chip is same as the first and second embodiments. That is, the test in FIG. 13 may be performed simultaneously on all the memory cells in the chip in parallel, or the memory cells may be divided into several groups to be tested group by group. Also, as shown in FIG. 6, a part of the step shown in FIG. 7 may be divided and the rest may be performed on all the memory cells at the same time.

With the third embodiment, it is necessary to produce the bias not used in the normal operation such as VBB_FW. The bias may be applied from the outside of the chip, but performing the test in this embodiment in a test mode is facilitated by adding a dedicated test circuit and a switching circuit for the same within the chip.

It should be noted that when this test is used for screening before shipment of products, the test is not allowed to deteriorate good memory cells other than memory cells having the VRT failures. Therefore, the bias condition for the step of applying the high reverse bias is determined in such a range that the good memory cells will not be deteriorated.

The test may be performed any time. Namely, the test may be performed during the wafer testing, after dicing of the wafer into chips, or after fabrication in a package.

FOURTH EMBODIMENT

Figure 16:
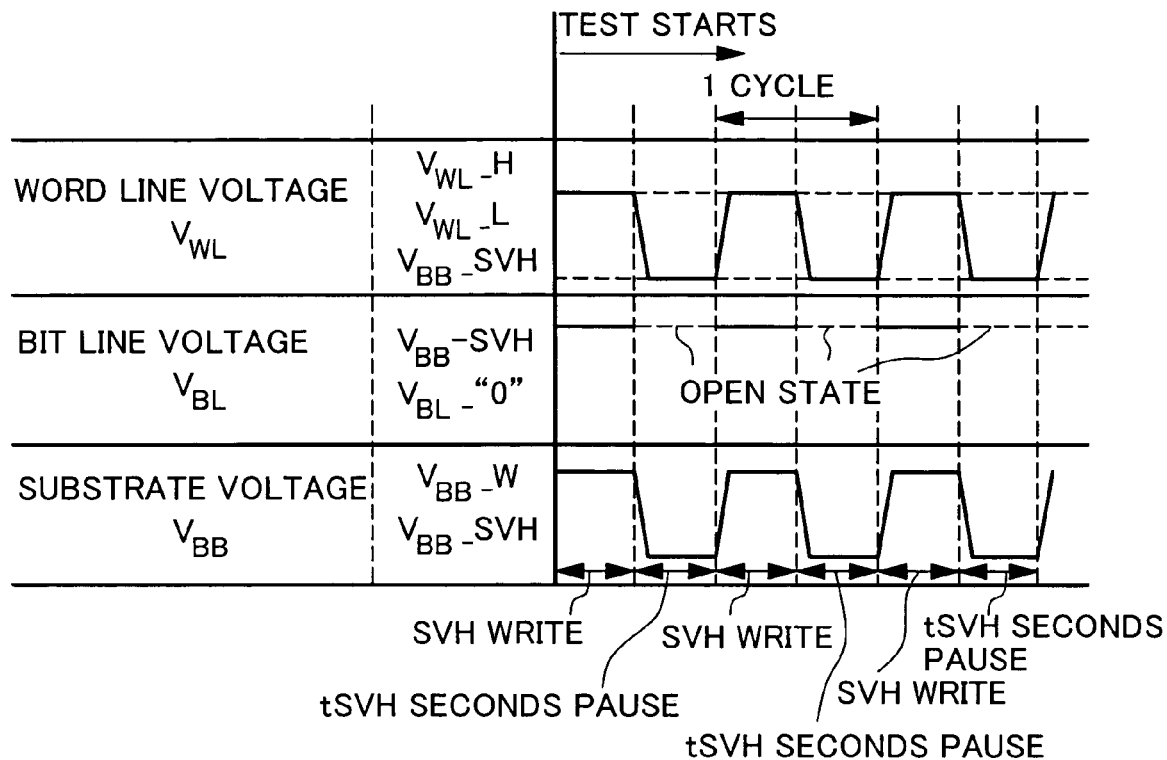
FIG. 16 is a schematic diagram illustrating a bias applying low in checking a DRAM in a fourth embodiment (an example of a flow of applying a voltage to each terminal under the reverse and high bias stress (SHV))

FIG. 16 is a view illustrating a stress applying method for screening VRT failures according to a fourth embodiment of the present invention. As described below, in the fourth embodiment, memory cells in which a VRT failure may occur due to a rewrite operation and which can not be screened off in the first to third embodiments can be screened.

In the VRT failure screening method described in the first to third embodiments, screening is performed by making use of the fact that a VRT fluctuation has a cycle. Especially, in the second and third embodiments, by making use of bias dependency in a VRT fluctuation cycle to artificially heighten an occurrence frequency of the bad state, screening of VRT-defective memory cells can be performed within a short period of time. Any of the first to third embodiments provides a screening technique effective when a VRT fluctuation has occurred.

VRT-defective fractions before and after a data rewrite operation is executed repeatedly were checked to find that a new VRT failure may occur after a rewrite operation is performed. As described above, cells having the provability of VRT failure in which a fluctuation has not been activated can not be detected in the first to third embodiments as described above.

Figure 17:
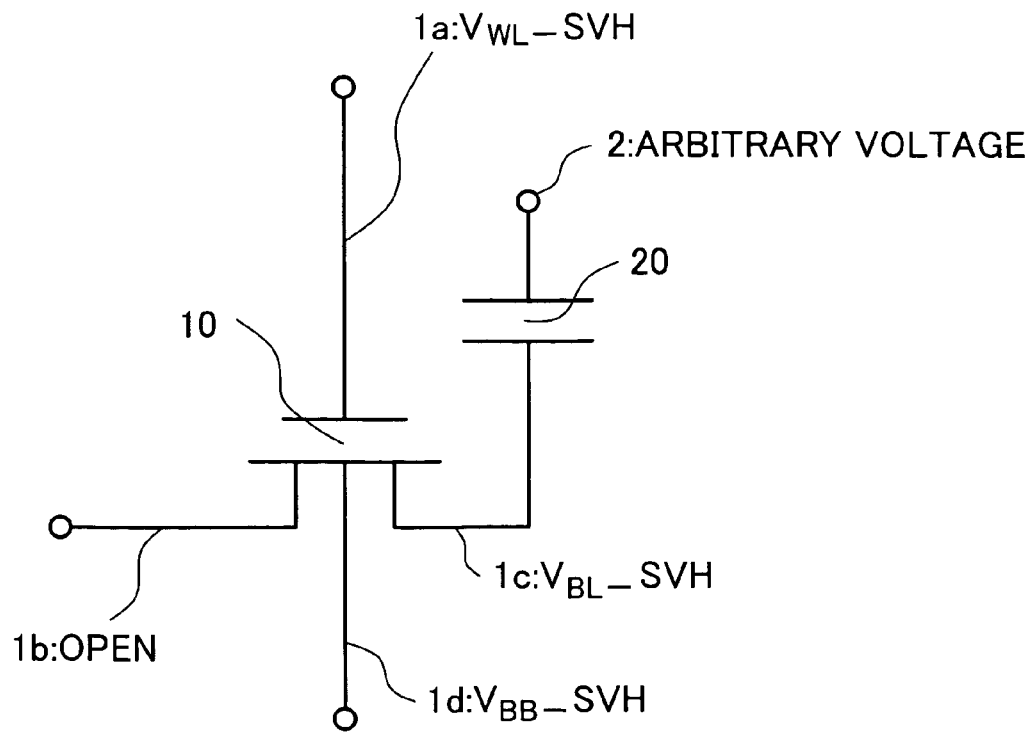
FIG. 17 is a schematic diagram illustrating a bias state in checking a DRAM in the fourth embodiment (in which a reverse and high bias stress (SVH) is applied (in the pause state for tSV seconds in FIG. 16))

A means for detecting the memory cells having the provability of VRT failure as described above were investigated to find that, by applying the high reverse bias as shown in FIG. 17 to a PN junction between a storage node and a substrate for a certain period of time as shown in FIG. 16, the "VRT failure activation" effect is provided of causing a VRT fluctuation in the cell that may have the VRT failure. The voltage applying flow in FIG. 16 is as described below.

At first, a "high" voltage VWL_H, a voltage VBL_SHV higher than the write "1" voltage VBL_"1", and a substrate voltage VBB_W for writing are simultaneously applied to the word line 1a, the bit line 1b, and the substrate terminal 1d respectively to charge the accumulator condenser 20 connected to the storage node 1c with the voltage VBL_SVH. Then the voltage VWL_SVH larger in the negative side than the "low" voltage VWL_L is applied to the word line 1a and a bias VBB_SVH larger in the negative side than the bias VBB_W to the substrate terminal 1b simultaneously. Any voltage can be applied to the bit line 1b, and electric potential control is not required as shown in FIG. 16. In this step, the memory cell transistor is turned OFF, and a high reverse bias substantially decided according to the voltage (VBL_SVH-VBB_SVH) and VWL_SVH is generated in the PN junction between the storage node and the substrate (Refer to FIG. 17). By applying the stress as described above N_SVH times, the "VRT failure activation" is realized.

Figure 18:
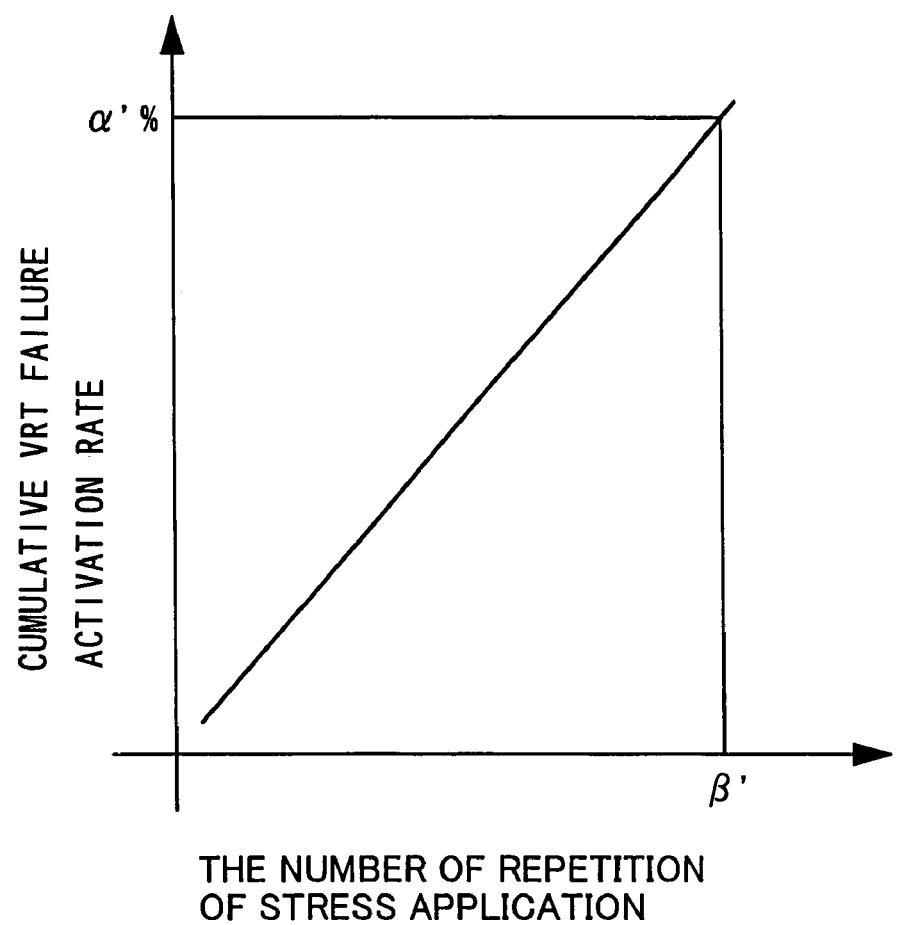
FIG. 18 is a schematic view illustrating a technique for optimizing conditions for checking a DRAM (in the fourth embodiment)

The N_SVH is a value optimized for activating the VRT fluctuation in a memory cell having the provability of VRT failure, and is determined, for instance, in development of a DRAM for testing. For instance, by obtaining a relation between a VRT failure activation fraction and times of repeated stress application as shown in FIG. 18, an optimized value as a condition for "VRT failure activation" is obtained from the cumulative VRT detection activation rate a' and the number of repetition of stress application β'. When the number of repletion of stress application increases, the activation rate becomes higher. However, when a period of time required for testing becomes longer, the production cost increases proportionately. Therefore, the testing time should be reduced as much as possible. Therefore, fixing the target activation rate and computing an optimal value for the number of repetition of stress application are important for cost reduction as well as realization of high reliability.

When the stress of "VRT failure activation" in the fourth embodiment is applied to all memory cells in a chip, the voltage application as shown in FIG. 16 should preferably be performed to a plurality of cells for shortening the testing time. For instance, that is, the test in FIG. 16 may be performed simultaneously on all the memory cells in the chip, or the memory cells may be divided into several groups to be tested group by group. Also, as shown in FIG. 6, a part of the step shown in FIG. 16 may be divided and the rest may be performed on all the memory cells at the same time.

In the fourth embodiment, by applying the high reverse bias stress as shown in FIG. 16 and FIG. 17 to a PN junction between a storage node and a substrate and then executing processing procedure in any of the first to third embodiments or processing procedures in all of the first to third embodiments, cells in which a VRT failure may occur anew due to a rewrite operation can be screened.

With the fourth embodiment, it is necessary to produce the bias not used in the normal operation such as VBB_FW. The bias may be applied from the outside of the chip, but performing the test in this embodiment in a test mode is facilitated by adding a dedicated test circuit and a switching circuit for the same within the chip.

It should be noted that when this test is used for screening before shipment of products, the test is not allowed to deteriorate good memory cells other than memory cells having the VRT failures. Therefore, the bias condition for the step of applying the high bias in the reverse direction is determined in such a range that the good memory cells will not be deteriorated.

The test may be performed any time. Namely, the test may be performed during the wafer testing, after dicing of the wafer into chips, or after fabrication in a package.

FIFTH EMBODIMENT

Figure 19:
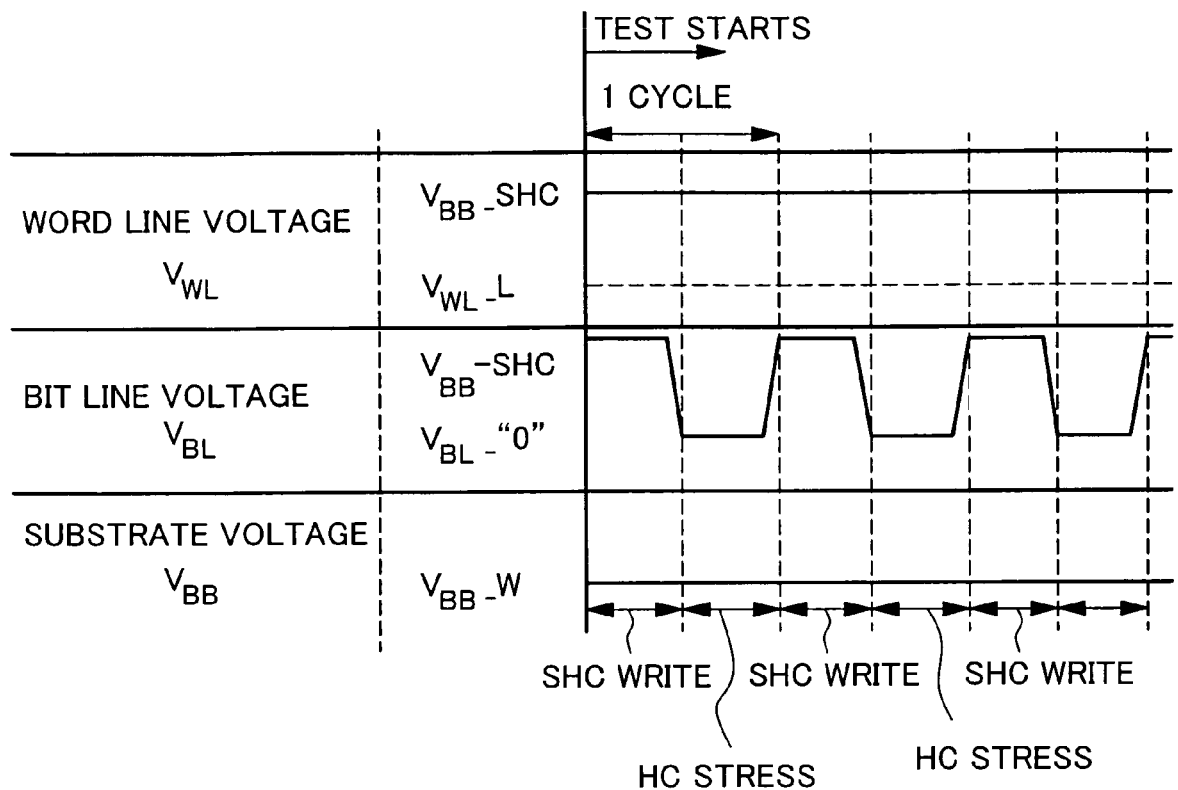
FIG. 19 is a schematic view illustrating a bias applying flow in checking a DRAM in a fifth embodiment (an example of applying a voltage to each terminal in hot carrier stress (SHC))

FIG. 19 is a stress applying method for screening VRT failures according to a fifth embodiment of the present invention. A feature of the fifth embodiment consists in that a process of the reverse and high bias stress application test described in the fourth embodiment is replaced with the hot carrier stress application test (FIG. 19).

As described also in the fourth embodiment, some of VRT failures are caused by a data rewrite operation. Therefore, a hot carrier stress (Refer to FIG. 20), which is such a state that a rewrite operation stress increased, was applied to a device to which no stress was applied in the past as shown in FIG. 19 to find that the "VRT failure activation" effect generating a VRT fluctuation in a memory cell having the provability of VRT failure is provided like in the case when a high bias stress is applied in the reverse direction as described in the fourth embodiment.

The voltage application flow in FIG. 19 is as described below.

At first, a voltage VWL_SHC larger than the "low" voltage VWL_L is applied to the word line 1a, a voltage VBL_SHC larger than the write "1" voltage VBL_"1" is applied to the bit line 1b, and the substrate voltage VBB_W for write is applied to the substrate terminal 1d simultaneously. Then the write "0" voltage is applied to the bit line 1b without changing states of other terminals. In this step, a diffused layer of the bit line 1b functions as a source and a diffused layer of the storage node 1c functions as a drain, and hot carriers are generated under a gate in the storage node side. In this step, a voltage value VWL_SHC applied to the word line 1a should preferably be selected such that a hot carrier is generated most frequently when the write "0" voltage is applied to the bit line 1b, the write "1" voltage to the storage node 1c, and the voltage VBB_W to the substrate terminal, respectively. By repeating application of the stress as described above N_SHC times, the "VRT failure activation" is realized.

The N_SHC is a value optimized for activating the VRT fluctuation in a memory cell having the provability of VRT failure, and is determined, for instance, in development of a DRAM for testing. For instance, as described in the fourth embodiment, by obtaining a relation between a VRT failure activation fraction and times of repeated stress application as shown in FIG. 18, an optimized value as a condition for "VRT failure activation" is obtained from the cumulative VRT detection activation rate a' and the number of repetition of stress application β'. When the number of repletion of stress application increases, the activation rate becomes higher. However, when a period of time required for testing becomes longer, the production cost increases proportionately. Therefore, the testing time should be reduced as much as possible. Therefore, fixing the target activation rate and computing an optimal value for the number of repetition of stress application are important for cost reduction as well as realization of high reliability.

When the stress of "VRT failure activation" in the fifth embodiment is applied to all memory cells in a chip, the voltage application as shown in FIG. 19 should preferably be performed to a plurality of cells for shortening the testing time. For instance, that is, the test in FIG. 19 may be performed simultaneously on all the memory cells in the chip, or the memory cells may be divided into several groups to be tested group by group. Also, as shown in FIG. 6, a part of the step shown in FIG. 19 may be divided and the rest may be performed on all the memory cells at the same time.

Figure 20:
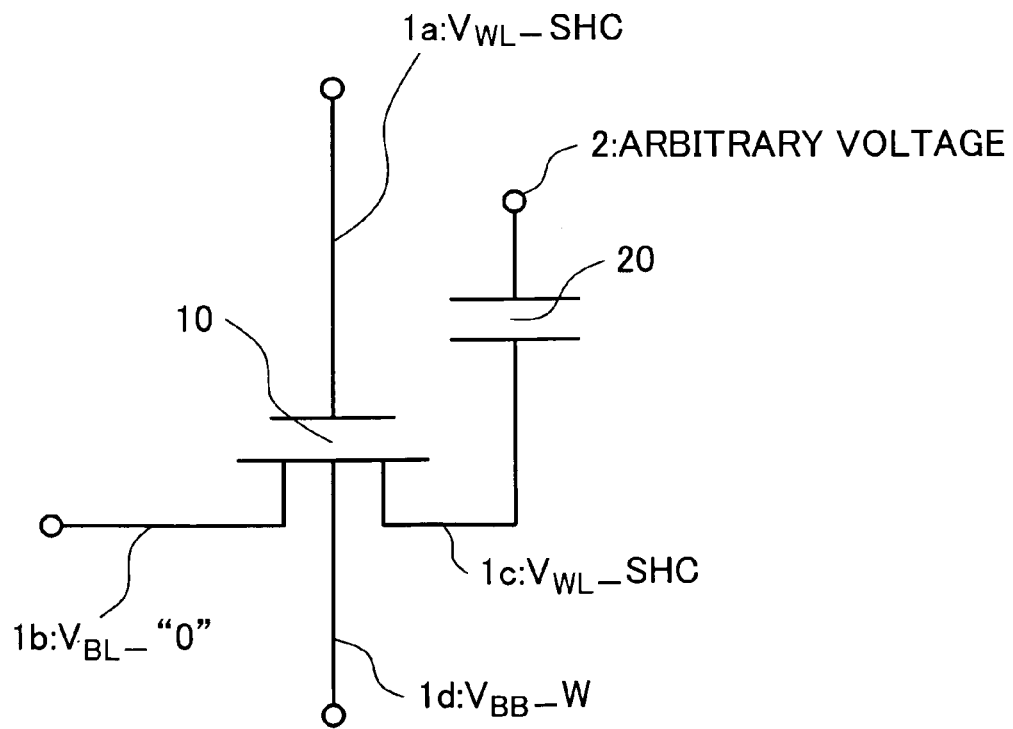
FIG. 20 is a schematic view illustrating a bias state in checking a DRAM in the fifth embodiment (in the hot carrier stress (SHC) applied state (in HC stress shown in FIG. 19)).

In the fifth embodiment, by applying the hot carrier stress as shown in FIG. 19 and FIG. 20 to a memory cell and then executing processing procedure in any of the first to third embodiments or processing procedures in all of the first to third embodiments, cells in which a VRT failure may occur anew due to a rewrite operation can be screened.

With the fifth embodiment, it is necessary to produce the bias not used in the normal operation such as VBL_SHC and VWL_SHC. The bias may be applied from the outside of the chip, but performing the test in this embodiment in a test mode is facilitated by adding a dedicated test circuit and a switching circuit for the same within the chip.

It should be noted that when this test is used for screening before shipment of products, the test is not allowed to deteriorate good memory cells other than memory cells having the VRT failures. Therefore, the bias condition for the step of applying a hot carrier stress is determined in such a range that the good memory cells will not be deteriorated.

The test may be performed any time. Namely, the test may be performed during the wafer testing, after dicing of the wafer into chips, or after fabrication in a package.

Signs used in the figures for the present application are described below.

1a: Word line
1b: Bit line
1c: Storage node
1d: Substrate terminal
2: Capacitor upper electrode
10: Memory cell transistor
20: Accumulator condenser

What is claimed is:

1. A method of checking a dynamic random access memory with a plurality of memory cell each having a data retention capability incorporated therein, comprising:
 a step of repeatedly executing a pause/refresh test for checking the memory cells for the data retention function several times under the substantially same testing conditions, thereby screening a retention failure caused by a random fluctuation in a data retention capability of the memory cell over time, and
 a step of applying a bias higher than a voltage applied for operations of the dynamic random access memory to a PN junction between a diffused layer of a storage node constituting the memory cell and a substrate in the reverse direction in repetition of the pause/refresh test before the pause/refresh operation is started.

2. The method of checking a dynamic random access memory according to claim 1,
 wherein the pause/refresh test for checking the memory cells for the data retention function is repeated up to N times decided according to a prespecified screening rate.

3. The method of checking a dynamic random access memory according to claim 1,
 wherein the pause/refresh test is repeated at a temperature higher than an operating temperature for use of the dynamic random access memory.

4. The method of checking a dynamic random access memory according to claim 1, further comprising:
 a step of applying, in repetition of the pause/refresh test, a reverse bias higher than a voltage applied for operations of the dynamic random access memory to a PN junction between a diffused layer of a storage node constituting the memory cell and a substrate before start of the pause/refresh operation, and then carrying out the pause/refresh test at an atmosphere in temperature higher than the operating temperature for use of the dynamic random access memory.

5. The method of checking a dynamic random access memory according to claim 1, further comprising:
 a step of stopping application of a voltage to all terminals of the memory cell, in repetition of the pause/refresh test, before start of the pause/refresh operation.

6. The method of checking a dynamic random access memory according to claim 1, further comprising:
 a step of stopping application of a voltage to all terminals of the memory cell, in repetition of the pause/refresh test, before start of the pause/refresh operation, and then carrying out the pause/refresh test at an atmosphere in temperature higher than the operating temperature for use of the dynamic random access memory.

7. The method of checking a dynamic random access memory according to claim 1, further comprising:
a step of stopping application of a voltage to all terminals of the memory cell, in repetition of the pause/refresh test, before start of the pause/refresh operation; and
a step of applying a reverse bias higher than a voltage applied for operations of the dynamic random access memory to a PN junction between a diffused layer on a storage node constituting the memory cell and a substrate,
wherein each of the steps is repeatedly executed up to N times.

8. The method of checking a dynamic random access memory according to claim 1, further comprising:
a step of repeating a write operation and a pause operation of the memory cell several times while applying a reverse bias higher than a voltage applied for operation of the dynamic random access memory to a PN junction between a diffused layer on a storage node constituting the memory cell and a substrate.

9. A method of checking a dynamic random access memory with a plurality of memory cell each having a data retention capability incorporated therein, comprising:
a step of repeatedly executing a pause/refresh test for checking the memory cells for the data retention function several times under the substantially same testing conditions, thereby screening a retention failure caused by a random fluctuation in a data retention capability of the memory cell over time, and
a step of applying a forward bias to a PN junction between a diffused layer on a storage node constituting the memory cell and a substrate, in repetition of the pause/refresh test, before start of the pause/refresh operation.

10. The method of checking a dynamic random access memory according to claim 9, further comprising:
a step of applying a forward bias to a PN junction between a diffused layer on a storage node constituting the memory cell and a substrate, in repetition of the pause/refresh test, before start of the pause/refresh operation, and then carrying out the pause/refresh test at an atmosphere in a temperature higher than the operating temperature for use of the dynamic random access memory.

11. The method of checking a dynamic random access memory according to claim 9, further comprising:
a step of applying a forward bias to a PN junction between a diffused layer on a storage node constituting the memory cell and a substrate, in repetition of the pause/refresh test, before start of the pause/refresh operation; and
a step of applying a reverse bias higher than a voltage applied for operations of the dynamic random access memory to a PN junction between a diffused layer on a storage node constituting the memory cell and a substrate;
wherein each of the steps is repeatedly executed up to N times.

12. A method of checking a dynamic random access memory with a plurality of memory cell each having a data retention capability incorporated therein, comprising:
a step of repeating a write operation of the memory cell several times under the bias condition generating hot carriers more than those generated during a write operation when the dynamic random access memory is running, and then,
a step of repeatedly executing a pause/refresh test for checking the memory cells for the data retention function several times under the substantially same testing conditions, thereby screening a retention failure caused by a random fluctuation in a data retention capability of the memory cell over time.

13. A dynamic random access memory comprising:
a pause/refresh test circuit for executing, in a dynamic random access memory having a plurality of memory cells each having a data retention function, a pause/refresh test for checking the memory cells for the data retention function;
a reverse bias test circuit for generating a reverse bias higher than a voltage applied for operation of the dynamic random access memory to a PN junction between a diffused layer on a storage node constituting the memory cell and a substrate; and
a switch circuit for switching between the pause/refresh test circuit and the reverse bias test circuit.

14. The dynamic random access memory according to claim 13,
wherein a forward bias test circuit for generating a forward bias different from the forward bias applied for operation of the dynamic random access memory to a PN junction between a diffused layer on a storage node constituting the memory cell and a substrate is provided in place of the reverse bias test circuit.

15. A dynamic random access memory comprising:
a test circuit for applying to the word line a voltage lower than a voltage applied to a word line in a write operation when the dynamic random access memory is running but higher than a voltage applied to the word line in a pause operation;
a test circuit for applying to the bit line a voltage higher than a voltage applied to a bit line in a write operation when the dynamic random access memory is running; and
a switch circuit for switching between the two circuits and a normal operation circuit of the dynamic random access memory.

* * * * *